United States Patent

Araki et al.

[11] Patent Number: 6,103,354
[45] Date of Patent: Aug. 15, 2000

[54] CERAMIC CIRCUIT SUBSTRATE AND METHOD OF FABRICATING THE SAME

[75] Inventors: Hideaki Araki, Nagoya; Kunihiko Mori, Gifu, both of Japan

[73] Assignee: Sumitomo Metal (SMI) Electronic Devices Inc., Mine, Japan

[21] Appl. No.: 08/934,674

[22] Filed: Sep. 22, 1997

[30] Foreign Application Priority Data

Sep. 30, 1996 [JP] Japan .................................. 8-258107

[51] Int. Cl.⁷ .............................. B32B 3/00; B32B 31/20; B32B 31/26
[52] U.S. Cl. .......................... 428/210; 428/594; 428/901; 419/22; 174/261; 156/89.12
[58] Field of Search .................................. 428/210, 594, 428/620, 901; 174/261; 419/22; 156/89.12

[56] References Cited

U.S. PATENT DOCUMENTS

| | | | |
|---|---|---|---|
| 4,324,815 | 4/1982 | Mitani et al. | 427/96 |
| 4,703,392 | 10/1987 | Robertson | 361/402 |
| 5,167,913 | 12/1992 | Acocella et al. | 428/620 |
| 5,171,642 | 12/1992 | DeHaven et al. | 428/620 |
| 5,250,394 | 10/1993 | Wei | 430/313 |
| 5,468,315 | 11/1995 | Okada et al. | 156/64 |
| 5,525,402 | 6/1996 | Nakamura et al. | 428/210 |
| 5,731,067 | 3/1998 | Asai et al. | 428/210 |

FOREIGN PATENT DOCUMENTS

| | | |
|---|---|---|
| 43 25 203 A1 | 2/1994 | Germany . |
| 4-354177 | 12/1992 | Japan . |

*Primary Examiner*—Deborah Jones
*Assistant Examiner*—Cathy F. Lam
*Attorney, Agent, or Firm*—Foley & Lardner

[57] ABSTRACT

A ceramic circuit substrate includes an insulating layer fabricated of a ceramic, a first surface conductor layer fabricated on a surface of the insulating layer and embedded in the insulating layer except at least its surface, and a second surface conductor layer fabricated to be stacked on the first surface conductor layer. A method of fabricating the ceramic circuit substrate includes the steps of printing a first surface conductor layer on a surface of a ceramic green sheet forming an insulating layer, laminating the green sheet and another green sheet on which an inner conductor layer is printed, and co-firing the green sheets, thereby fabricating the first surface conductor layer on a surface of a multilayer substrate, and printing a second surface conductor layer on the first surface conductor layer so that the second surface conductor layer is stacked on the first surface conductor layer and firing the second surface conductor layer, thereby fabricating the two stacked surface conductor layers on the surface of the multilayer substrate.

8 Claims, 1 Drawing Sheet

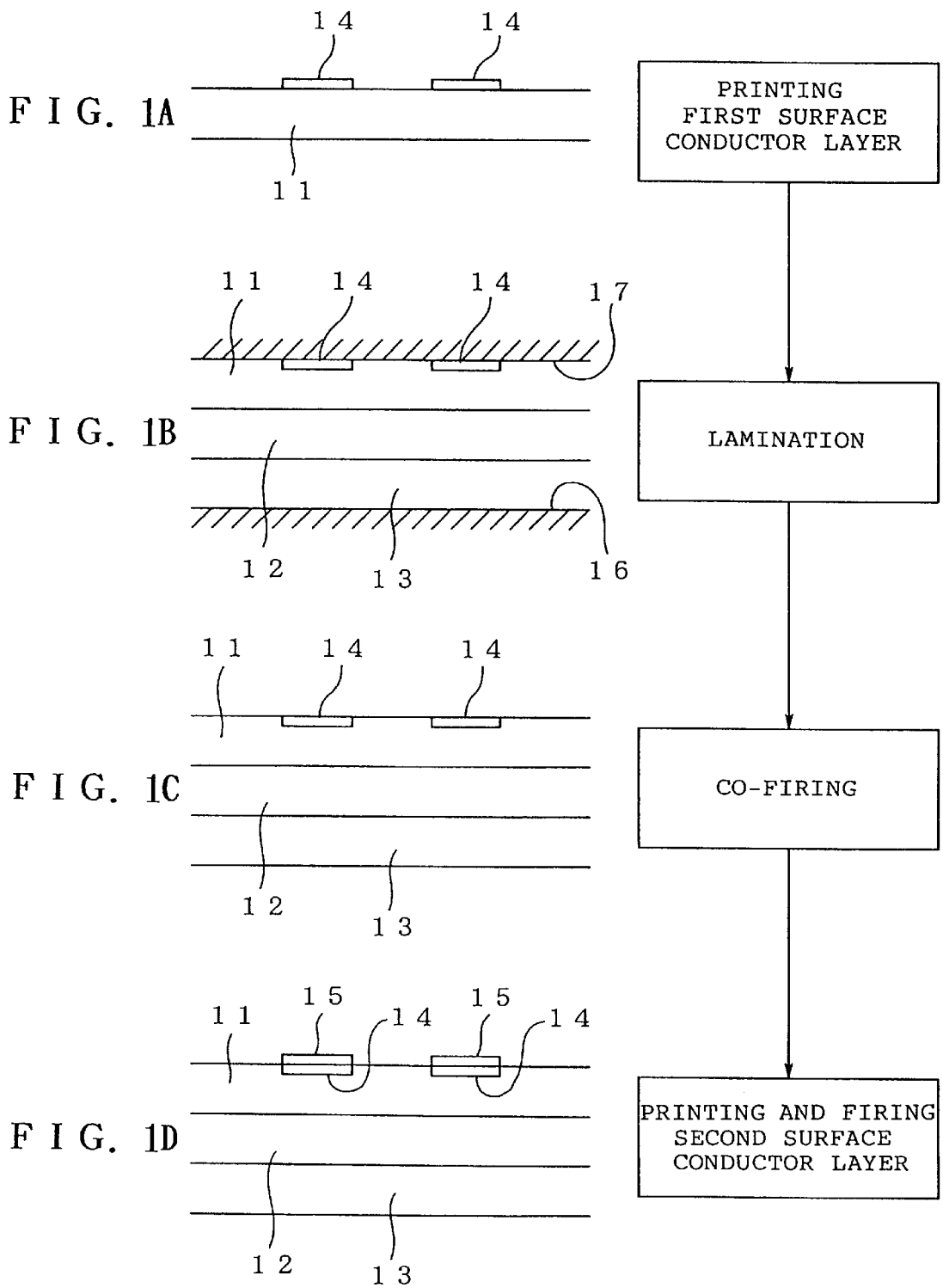

CERAMIC CIRCUIT SUBSTRATE AND METHOD OF FABRICATING THE SAME

BACKGROUND OF THE INVENTION

1. Field of the Invention

This invention relates to a ceramic circuit substrate having a low resistance surface conductor layer formed on the surface thereof and a method of fabricating the ceramic circuit substrate.

2. Description of the Prior Art

Ceramic substrates have a higher heat resistance and a smaller coefficient of thermal expansion than resinous printed circuit boards. Furthermore, fine wiring patterns can be formed on the ceramic substrates more easily than on the resinous printed circuit boards. For these reasons, the ceramic substrates have widely been used as substrates for various types of ICs which have recently been required to be small in size, to be operated on a high-frequency power, and to be operated at high speeds. These requirements for ICs have recently been intensified. A dielectric constant of the ceramic material and the resistance of the surface conductor layer formed on the surface of the ceramic substrate need to reduced in order that the above-described requirements may be met.

A conducting sectional area of the surface conductor layer of the ceramic substrate tends to be reduced due to fining the wiring patterns, and a sheet resistance thereof tends to be increased accordingly. To prevent the increase in the sheet resistance, the prior art has proposed thickening the surface conductor layer to thereby increase the conducting sectional area so that a low resistance surface conductor layer is provided.

Screen printing which yields a high productivity is generally used to fabricate the surface conductor layer. However, sagging and bleeding of a paste irregularly spread the line width of printed wiring patterns when a surface conductor layer is printed thick on the surface of a fired ceramic substrate. Consequently, it is difficult to print a fine wiring patterns sharp and thick. Furthermore, the prior art has proposed thick printing a surface conductor layer on the surface of a green sheet prior to firing and co-firing the printed surface conductor layer with the green sheet. However, the ceramic differs from the surface conductor layer in the shrinkage characteristic during the co-firing. This difference in the shrinkage characteristic results in occurrence of camber and/or waviness in the ceramic substrate, thereby reducing the yield and product quality.

SUMMARY OF THE INVENTION

Therefore, an object of the present invention is to provide a ceramic circuit substrate wherein both a reduction in the resistance of the surface conductor layer thereof (increase in the conducting sectional area) and fining the wiring patterns of the surface conductor layer can be achieved and occurrence of camber and/or waviness can be prevented so that the product quality can be improved, and a method of fabricating such a ceramic circuit substrate.

In one aspect, the present invention provides a ceramic circuit substrate comprising an insulating layer fabricated of a ceramic, a first surface conductor layer fabricated on a surface of the insulating layer and embedded in the insulating layer except at least a surface thereof, and a second surface conductor layer fabricated to be stacked on the first surface conductor layer.

another aspect, the invention provides a method of fabricating a ceramic circuit substrate comprising the steps of printing a first surface conductor layer on a surface of a ceramic green sheet forming an insulating layer, laminating the green sheet and another green sheet on which an inner conductor layer is printed, and co-firing the green sheets, thereby fabricating the first surface conductor layer on a surface of a multilayer substrate, and printing a second surface conductor layer on the first surface conductor layer so that the second surface conductor layer is stacked on the first surface conductor layer, and firing the second surface conductor layer, thereby fabricating the two stacked surface conductor layers on the surface of the multilayer substrate.

According to the above-described ceramic circuit substrate and the method of fabricating the substrate, the printing of the surface conductor layer is carried out twice. Accordingly, the surface conductor layer need not be printed thick. Furthermore, the first surface conductor layer is pressed into the green sheet by the pressure applied when the green sheets are laminated. Since the difference of level between the surface of the first surface conductor layer and the substrate surface is reduced, the second surface conductor layer can readily be printed, and occurrence of sagging and/or bleeding of the paste can be reduced. Moreover, since a single surface conductor layer is co-fired with the ceramic substrate, the occurrence of camber and/or waviness in the ceramic substrate due to the difference in the shrinkage characteristic can be reduced as compared with the case where a thick printed surface conductor layer is co-fired with the ceramic substrate. Furthermore, the first surface conductor layer is printed on the substrate surface and then fired. Subsequently, the second surface conductor layer is printed on the first surface conductor layer so as to be stacked on the latter and then fired. Consequently, an overall thickness of the surface conductor layer can be increased and accordingly, the resistance of the surface conductor layer can be reduced.

The first and second surface conductor layers may be fabricated of conductor pastes having the same composition or different composition from each other. A printed pattern of the first surface conductor layer preferably has the same line width as a printed pattern of the second surface conductor layer.

The green sheets are preferably laminated while being pressurized between parallel flat plates. Consequently, the first surface conductor layer can uniformly be pressed into the green sheet. Furthermore, a laminate of the green sheets and the first surface conductor layer are preferably co-fired while being pressurized. In this manner, the first surface conductor layer can be fired while being held pressed in the green sheet by the pressure during the firing step. Consequently, the first surface conductor layer pressed into the green sheet can be prevented from being pushed back by the elasticity of the green sheet during the firing.

BRIEF DESCRIPTION OF THE DRAWINGS

Other objects, features and advantages of the present invention will become clear upon reviewing the following description of preferred embodiments thereof, made with reference to the accompanying drawings, in which:

FIGS. 1A to 1D illustrate steps of fabricating the ceramic circuit substrate of one embodiment in accordance with the present invention.

DETAILED DESCRIPTION OF THE PREFERRED EMBODIMENT

One embodiment of the present invention will be described. The invention is applied to a low-temperature fired ceramic multilayer circuit substrate in the embodiment. The method of fabricating the ceramic circuit substrate will first be described with reference to the drawings. Low-temperature firable green sheets 11 to 13 forming insulating layers of the ceramic substrate are fabricated as follows. A low-temperature firable ceramic powder is made by mixing 50 to 65% (preferably, 60%) of glass powder of CaO—$Al_2O_3$—$SiO_2$—$B_2O_3$ system by weight and 50 to 35% (preferably, 40%) of alumina powder by weight. A solvent such as toluene or xylene, a binder such as acrylic resin, and a plasticizer such as dioctyl adipate (DOA) are added to the mixed powder. The mixture is sufficiently blended so that a slurry is obtained. The slurry is made by a doctor blade process into the green sheets.

The green sheets are cut by punch dies or a punching machine (neither shown) so as to have predetermined dimensions. Via holes (not shown) are formed at predetermined locations in the green sheets by means of punching. The green sheets 11 to 13 forming layers of the ceramic substrate is thus fabricated. The via holes of each of the green sheets 11 to 13 are filled with a conductor paste of Ag system such as Ag, Ag/Pd, or Ag/Pt. The Ag conductor paste having the same composition as described above is screen-printed on the surface layer green sheet 11 to be formed into a first surface conductor layer 14 as shown in FIG. 1A. The Ag conductor paste having the same composition as described above is screen-printed on the inner layer green sheets 12 and 13 to be formed into inner conductor layers (not shown). Another paste of metal having a low melting point, for example, Cu or Au, may be used instead of the Ag conductor paste.

Upon completion of the printing step, the green sheets 11 to 13 are laminated to one upon another into a laminate, as shown in FIG. 1B. The laminate is put between parallel disposed flat plates 16 and 17 and then heated at a temperature ranging between 80 and 150° C. (preferably, 100° C.) while being pressurized at a pressure ranging between 50 and 250 kgf/cm$^2$ (preferably, 100 kgf/cm$^2$), thereby being bonded into an integral body. In this process, the first surface conductor layer 14 printed on the surface of the green sheet 11 forming the surface of the ceramic substrate is pressed into the green sheet 11 by the pressure applied by the parallel flat plates 16 and 17. As a result, the surface of the green sheet 11 is substantially planar with the surface of the first surface conductor layer 14 such that there is substantially no difference of level between both surfaces.

A part of the first surface conductor layer 14 pressed into the green sheet 11 is reduced when the applied pressure during the laminating step is small. Consequently, an upper portion of the first surface conductor layer 14 projects from the surface of the green sheet 11. Even in this condition, the difference of level between the surfaces of the first surface conductor layer 14 and the substrate surface can be reduced. As a result, a second surface conductor layer 15 can readily be printed as will be described later.

Subsequently to the lamination of green sheets 11 to 13, the laminate is co-fired with conductor layers at a temperature ranging between 800 and 1,000° C. (preferably, 900° C.) for 20 minutes. Consequently, the first surface conductor layer 14 is fired and embedded in the insulating layer 11 except a surface thereof, as shown in FIG. 1C. The laminate can be fired in an oxidizing atmosphere (air) when each conductor is made of Ag, Ag/Pd, Ag/Pt, or Au. However, the laminate needs to be fired in a reducing atmosphere for inhibition of oxidation when each conductor layer is made of Cu.

Subsequently to the firing of the substrate, the second surface conductor layer 15 is screen-printed on the first surface conductor layer 14 formed on the substrate surface so as to be stacked thereon, as shown in FIG. 1D. Conductor pastes used to fabricate the respective first and second surface conductor layers 14 and 15 have the same composition. A printing pattern for the first surface conductor layer 14 has the same line width as a printing pattern for the second surface conductor layer 15. After the screen-printing, the second surface conductor layer 15 is fired at a temperature ranging between 800 to 1,000° C. (preferably, 900° C.) for 10 minutes. Fabrication of the ceramic multilayer substrate with the two surface conductor layers formed on the substrate surface is thus completed.

The inventor carried out an experiment to evaluate a two-layer structure of the surface conductor layer as described above in the embodiment. In the experiment, the surface conductor layer of two-layer structure of the embodiment was compared with surface conductor layers each having a single layer structure (compared cases 1 to 3).

TABLE 1

|  | Thickness of first conductor layer | Thickness of second conductor layer | Sheet resistance | Sagging and/or bleeding of paste | Camber and/or waviness |
| --- | --- | --- | --- | --- | --- |
| Embodiment | 9 μm | 11 μm | 3.4 mΩ/□ | 16 μm | 24 μm/10 mm |
| Compared case 1 | 9 μm | — | 7.2 mΩ/□ | 7 μm | 23 μm/10 mm |
| Compared case 2 | 17 μm | — | 3.6 mΩ/□ | 10 μm | 55 μm/10 mm |
| Compared case 3 | — | 21 μm | 3.2 mΩ/□ | 43 μm | 17 μm/10 mm |

The first surface conductor layer of the two-layer structure of the embodiment has a thickness of 9 μm and the second surface conductor layer thereof has a thickness of 11 μm. In the embodiment, the value of sheet resistance is 3.4 mΩ/□, which value is small and meets the requirement for reduction in the resistance of the surface conductor layer. The values of sagging and/or bleeding, and camber and waviness are 16 μm and 24 μm/10 mm respectively, which values show satisfied results. One reason for the small value of sagging and/or bleeding is that the surface conductor layer need not be printed thick since the printing of the surface conductor layer is carried out twice. Another reason is that the first surface conductor layer is pressed into the green sheet by the pressure applied during the lamination of the green sheets. Since the difference of level between the surface of the first surface conductor layer and the substrate surface is reduced, the second surface conductor layer is readily printed.

The reason for the small value of camber and/or waviness is that since the surface conductor layer co-fired with the ceramic substrate is of a single-layer structure type, a tensile stress the surface conductor layer applies to the substrate surface is rendered smaller as compared with the case where a thick printed surface conductor layer is co-fired as in compared case 2.

Compared case 1 represents the prior art and uses no second surface conductor layer. In compared case 1, the surface conductor layer is thin and the conducting sectional area is small. Consequently, compared case 1 indicates a large sheet resistance value of 7.2 mΩ/□. Since the printing of the surface conductor layer is carried out only once in compared case 1, the value of sagging and/or bleeding is smaller than that of the embodiment.

In compared case 2, a surface conductor layer having a thickness of 17 μm is printed on the green sheet at one printing step. Subsequently, the surface conductor layer is co-fired with the ceramic substrate. Compared case 2 has no second surface conductor layer. In this case, the value of sheet resistance is 3.6 mΩ/□, which value is small. However, the tensile stress the thick surface conductor layer applies to the substrate surface is rendered large. Consequently, the value of camber and waviness of the ceramic substrate is 55 µm/10 mm, which value is larger than that in the embodiment.

In compared case 3, a substrate with no printed surface conductor layers is fired. Subsequently, a thick surface conductor layer having a thickness of 21 µm is printed on the substrate surface and then fired. In this case, the value of sheet resistance is 3.2 mΩ/□, which value is small too. However, since the surface conductor layer is printed thick on the fired substrate surface, the value of sagging and/or bleeding is 43 µm, which value is large. Consequently, it is difficult to form fine wiring patterns on the ceramic substrate. In compared case 3, the surface conductor layer applies no tensile stress to the substrate surface when the substrate is fired. Consequently, the value of camber and/or waviness of the ceramic substrate is 17 µm/10 mm, which value is small.

Although the first and second surface conductor layers 14 and 15 are fabricated of the conductor pastes having the same composition in the foregoing embodiment, they may be fabricated of conductor pastes having different composition from each other. In this case, for example, the firing temperature of the second surface conductor layer 15 can be rendered lower than the firing temperature of the first surface conductor layer 14.

Furthermore, the laminate of green sheets may be co-fired with the first surface conductor layer while being pressurized by a pressure ranging between 2 and 20 kgf/cm$^2$. Consequently, an amount of shrinkage due to the firing can be reduced in the ceramic circuit substrate and surface conductor layer. Furthermore, the first surface conductor layer pressed into the green sheet can be prevented from being pushed back by the elasticity of the green sheet during the firing.

The mixture of glass powder of $CaO$—$Al_2O_3$—$SiO_2$—$B_2O_3$ system and alumina powder is used as the low-temperature firable ceramic material in the foregoing embodiment. The low-temperature firable ceramic may be made of a mixture of glass powder of $MgO$—$Al_2O_3$—$SiO_2$—$B_2O_3$ system and alumina powder, a mixture of glass powder of $SiO_2$—$B_2O_3$ system and alumina powder, or a mixture of glass powder of $PbO$—$SiO_2$—$B_2O_3$ system and alumina powder, instead. Furthermore, a ceramic material firable at the temperature of 800 to 1,000° C. such as a crystallized glass of cordierite system may also be used as the material for the low-temperature firable ceramic.

The present invention is applied to the low-temperature fired ceramic circuit substrate in the foregoing embodiment. The invention may be applied to an alumina circuit substrate, an AlN circuit substrate, and other ceramic substrates.

The foregoing description and drawings are merely illustrative of the principles of the present invention and are not to be construed in a limiting sense. Various changes and modifications will become apparent to those of ordinary skill in the art. All such changes and modifications are seen to fall within the true spirit and scope of the invention as defined by the appended claims.

We claim:
1. A ceramic circuit substrate comprising:
an insulating layer fabricated of a ceramic;
a first surface conductor pattern layer fabricated on a surface of the insulating layer and embedded in the insulating layer except at least a surface thereof, without penetrating the insulating layer; and
a second surface conductor pattern layer fabricated to be stacked on the first surface conductor pattern layer.
2. A ceramic circuit substrate comprising:
an insulating layer fabricated of a ceramic;
a first surface conductor pattern layer fabricated on a surface of the insulating layer and embedded in the insulating layer except at least a surface thereof; and
a second surface conductor pattern layer fabricated to be stacked on the first surface conductor pattern layer,
wherein the first and second surface conductor pattern layers are fabricated of conductor pastes having the same composition.
3. A ceramic circuit substrate according to claim 1, wherein the first and second surface conductor pattern layers are fabricated of conductor pastes having different composition from each other.
4. A ceramic circuit substrate comprising:
an insulating layer fabricated of a ceramic;
a first surface conductor pattern layer fabricated on a surface of the insulating layer and embedded in the insulating layer except at least a surface thereof; and
a second surface conductor pattern layer fabricated to be stacked on the first surface conductor pattern layer,
wherein a printed pattern of the first surface conductor pattern layer has the same line width as a printed pattern of the second surface conductor pattern layer.
5. A ceramic circuit substrate comprising:
an insulating layer fabricated of a ceramic;
a first surface wiring pattern layer fabricated on a surface of the insulating layer and embedded in the insulating layer except at least a surface thereof, without penetrating the insulating layer; and
a second surface wiring pattern layer fabricated to be stacked on the first surface wiring pattern layer.
6. A method of fabricating a ceramic circuit substrate as claimed in claim 1, comprising the steps of:
printing a first surface conductor layer on a surface of a ceramic green sheet forming an insulating layer;
laminating the green sheet and another green sheet on which an inner conductor layer is printed, and co-firing the green sheets, thereby fabricating the first surface conductor layer on a surface of a multilayer substrate; and
printing a second surface conductor layer on the first surface conductor layer so that the second surface conductor layer is stacked on the first surface conductor layer, and firing the second surface conductor layer, thereby fabricating the two stacked surface conductor layers on the surface of the multilayer substrate.
7. The method according to claim 6, wherein the green sheets are laminated while being pressurized between parallel flat plates.
8. The method according to claim 6, wherein a laminate of the green sheets and the first surface conductor layer are co-fired while being pressurized.

* * * * *